US008134100B2

(12) United States Patent
Kobayashi et al.

(10) Patent No.: US 8,134,100 B2
(45) Date of Patent: Mar. 13, 2012

(54) HEAT PROCESSING FURNACE AND METHOD OF MANUFACTURING THE SAME

(75) Inventors: Makoto Kobayashi, Nirasaki (JP); Ken Nakao, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 738 days.

(21) Appl. No.: 12/155,095

(22) Filed: May 29, 2008

(65) Prior Publication Data

US 2008/0296282 A1    Dec. 4, 2008

(30) Foreign Application Priority Data

Jun. 1, 2007   (JP) .................................. 2007-146733

(51) Int. Cl.
*F27D 11/00*   (2006.01)
*F27D 7/06*    (2006.01)

(52) U.S. Cl. ........ 219/385; 219/389; 219/391; 219/393; 219/395; 219/396; 219/402; 219/403; 219/406; 219/408; 373/110; 373/111; 373/112; 373/118; 373/119; 373/127; 373/128; 373/130; 373/131; 29/611

(58) Field of Classification Search .................. 219/385, 219/389–91, 393, 395–6, 402–3, 406–8; 373/110–112, 118–9, 127–8, 130–31; 29/611
See application file for complete search history.

(56) References Cited

U.S. PATENT DOCUMENTS 6,008,477 A * 12/1999 Nakao et al. .................. 219/390

FOREIGN PATENT DOCUMENTS

| CN | 1941287 A | 4/2007 |
|----|-----------|--------|
| JP | 7-253276 | * 10/1995 |
| JP | 08-064546 | 3/1996 |
| JP | 10-233277 | 9/1998 |
| JP | 2006-80058 | * 3/2006 |
| JP | 2007-88325 | 4/2007 |
| WO | 2007/023855 | 3/2007 |

OTHER PUBLICATIONS

Japanese Office Action issued on May 26, 2009 for Japanese Patent Application No. 2007-146733 with English translation.
Chinese Office Action issued on Aug. 12, 2010 for Chinese Application No. 200810109373.7 with English translation.

* cited by examiner

*Primary Examiner* — Shawntina Fuqua
(74) *Attorney, Agent, or Firm* — Smith, Gambrell & Russell, LLP

(57) ABSTRACT

A heat processing furnace comprises: a processing vessel for receiving an object to be processed by a heat process; a cylindrical heat insulation member surrounding the processing vessel; a helical heating resistor arranged along an inner peripheral surface of the heat insulation member; a support member for supporting the heating resistor. The support member includes a base part positioned on an inside of the heating resistor, and a plurality of support pieces extending radially outward from the base part through spaces between adjacent portions of the heating resistor so as to support the heating resistor, the support member being formed to have a comb-like shape. An upper surface part of each of the support pieces is formed to have a curved shape in order to reduce a frictional resistance generated when the heating resistor is moved upon a thermal expansion and a thermal shrinkage thereof.

8 Claims, 12 Drawing Sheets

HEAT PROCESSING FURNACE AND METHOD OF MANUFACTURING THE SAME

CROSS REFERENCE TO RELATED APPLICATIONS

This application is based upon and claims the benefit of priority from the prior Japanese Patent Application No. 2007-146733 filed on Jun. 1, 2007, the entire contents of which are incorporated herein by reference.

FIELD OF THE INVENTION

The present invention relates to a heat processing furnace and a method of manufacturing the same.

BACKGROUND ART

When a semiconductor device is manufactured, various kinds of heat processing apparatuses are employed for subjecting a semiconductor wafer, which is an object to be processed, to processes such as an oxidation process, a diffusion process, and a CVD (Chemical Vapor Deposition) process. A general heat processing apparatus includes a heat processing furnace which is composed of: a processing vessel (also referred to as "reaction tube") in which a semiconductor wafer can be accommodated and heat-processed; a heating resister (also referred to as "heating wire" or "element") disposed around the processing vessel; and a heat insulation member disposed around the heating resistor. The heating resistor is arranged on an inner wall surface of the heat insulation member via a support member (see, Patent Document 1).

In a heat processing apparatus capable of performing a batch process, for example, there is used, as the heating resistor, a helical heating resistor arranged along an inner wall surface of a cylindrical heat insulation member. The heating element can heat an inside of the furnace to a high temperature such as about 800° C. to 1000° C. As the heat insulation member, there is used a member that is formed by burning a heat insulation material, such as ceramic fibers, into a cylindrical shape. The heat insulation member can reduce a heat quantity which is lost as radiant heat and conductive heat, so as to enhance efficiency in heating. As the support member, there is used a ceramic member having a comb-like shape, for example. The ceramic support member can support the heating resistor at predetermined pitches, while allowing a thermal expansion and a thermal shrinkage of the heating resistor. In such a heat processing furnace, the heating resistor is formed to have a helical shape, and is supported such that a clearance is defined between the heating resistor and the heat insulation member for allowing the thermal expansion and the thermal shrinkage. Thus, different from a heating resistor which is embedded in a heat insulation member, heat confinement in the heating resistor itself can be prevented, and an object to be heated (wafer) can be directly heated. Accordingly, it is possible to improve durability of the heating resistor (to extend a lifetime), to save energy, and to rapidly increase and decrease a temperature.

[Patent Document 1] JP10-233277A

In a conventional heat processing furnace, as shown in FIG. 21, a support piece of a support member 13 for supporting a heating resistor 5 has a rectangular shape in cross-section. Namely, the heating resistor 5 is supported by a corner portion 50 of the support piece 18. Thus, when the heating resistor 5 is thermally expanded or thermally shrunk, a large frictional resistance is generated between the support piece 18 of the support member 13 and the heating resistor 5, so that movement of the heating resistor is inhibited. In this case, the heating resistor undergoes a permanent deformation caused by a residual stress, which invites deterioration in durability (reduction in lifetime). In particular, when the heating resistor is heated to be thermally expanded and then cooled to be thermally shrunk, there is a tendency that a permanent elongation (permanent deformation) of the heating resistor is promoted by the residual stress caused by the frictional resistance between the support member and the heating resistor, resulting in deterioration in durability of the heating resistor.

DISCLOSURE OF THE INVENTION

The present invention has been made in view of the above circumstances. The object of the present invention is to provide a heat processing furnace and a method of manufacturing the same, capable of reducing a frictional resistance, which is generated between a support member and a heating resistor when the heating resistor is thermally expanded and thermally shrunk, so that generation of a permanent deformation of the heating resistor caused by a residual stress thereof can be restrained to thereby improve durability of the heating resistor.

The present invention is a heat processing furnace comprising: a processing vessel capable of accommodating an object to be processed and subjecting the object to be processed to a heat process; a cylindrical heat insulation member surrounding the processing vessel; a helical heating resistor arranged along an inner peripheral surface of the heat insulation member; a support member disposed on the inner peripheral surface of the heat insulation member in parallel with an axial direction thereof, for supporting the heating resistor at predetermined pitches along the axial direction; and a plurality of terminal plates axially arranged on an outside of the heating resistor at suitable intervals therebetween, the terminal plates radially passing through the heat insulation member so as to be extended outside; wherein: the support member includes a base part positioned on an inside of the heating resistor, and a plurality of support pieces extending radially outward from the base part through spaces between adjacent portions of the heating resistor so as to support the heating resistor, the support member being formed to have a comb-like shape; and an upper surface part of each of the support pieces is formed to have a curved shape in order to reduce a frictional resistance generated when the heating resistor is moved upon a thermal expansion and a thermal shrinkage thereof.

The present invention is the heat processing furnace, wherein: each of the support pieces of the support member is formed to have a rectangular cross-section; the heating resistor is arranged on the inner peripheral surface of the heat insulation member such that the heating resistor is helically inclined; and at least one of corner portion of the upper surface part of the support piece supporting the heating resistor is formed to have a curved shape or a chamfered shape.

The present invention is a heat processing furnace comprising: a processing vessel capable of accommodating an object to be processed and subjecting the object to be processed to a heat process; a cylindrical heat insulation member surrounding the processing vessel; a helical heating resistor arranged along an inner peripheral surface of the heat insulation member; a support member disposed on the inner peripheral surface of the heat insulation member in parallel with an axial direction thereof, for supporting the heating resistor at predetermined pitches along the axial direction; and a plurality of terminal plates axially arranged on an outside of the heating resistor at suitable intervals therebetween, the terminal plates radially passing through the heat insulation member so as to be extended outside; wherein: the support member includes a plurality of tubular members each having one end being embedded in the heat insulation member and the other end projecting radially inward; and the heating resistor is supported on curved upper surface parts of the tubular members.

The present invention is the heat processing furnace, wherein: a linear member for preventing falling of the heating resistor is disposed between the inner ends of the tubular members, which are adjacent to each other in an up and down direction; and the linear member passes through shaft holes of the upper and the lower tubular members so as to be embedded and fixed in the heat insulation member.

The present invention is the heat processing furnace, wherein a support column for preventing falling of the heating resistor is disposed on the inner ends of the tubular members, which are arranged in an up and down direction.

The present invention is the heat processing furnace, wherein an annular member for preventing falling of the heating resistor is fitted in the inner end of each of the tubular members.

The present invention is the heat processing furnace, wherein each of the tubular members is structured as a blowing nozzle for a forcible cooling operation.

The present invention is the heat processing furnace, wherein each of the tubular members is located such that an inner end side thereof is inclined downward.

The present invention is a method of manufacturing a heat processing furnace comprising: a processing vessel capable of accommodating an object to be processed and subjecting the object to be processed to a heat process; a cylindrical heat insulation member surrounding the processing vessel; a helical heating resistor arranged along an inner peripheral surface of the heat insulation member; and a support member disposed on the inner peripheral surface of the heat insulation member in parallel with an axial direction thereof, for supporting the heating resistor at predetermined pitches along the axial direction; the method comprising the steps of: preparing: a helical heating resistor having a plurality of terminal plates arranged along an axial direction; a support member of a comb-like shape, including a base part positioned on an inside of the heating resistor, and a plurality of support pieces extending radially outward from the base part through spaces between adjacent portions of the heating resistor so as to support the heating resistor, with an upper surface part of each of the support pieces being formed to have a curved shape in order to reduce a frictional resistance generated when the heating resistor is moved upon a thermal expansion and a thermal shrinkage thereof; and a jig that arranges the support member in a position in a circumferential direction of the heating resistor so as to axially align the support member; placing the heating resistor on the jig through the support member while rotating the jig; disposing a filter member on an outer periphery of the heating resistor excluding the terminal plates and the support pieces of the support member, and circumferentially disposing on the filter member narrow rod members at suitable intervals therebetween along an axial direction of the heating resistor; immersing the heating resistor into a suspension containing inorganic fibers constituting a heat insulation material, and depositing the heat insulation material on the filter member by a suction from an inside of the heating resistor; drying the heat insulation material deposited on the filter member so as to form a heat insulation member; pulling out the rod members from between the heat insulation member and the filter member after the drying step, and further pulling out the filter member from between the heat insulation member and the heating resistor; and removing the jig from the support member.

The present invention is a method of manufacturing a heat processing furnace comprising: a processing vessel capable of accommodating an object to be processed and subjecting the object to be processed to a heat process; a cylindrical heat insulation member surrounding the processing vessel; a helical heating resistor arranged along an inner peripheral surface of the heat insulation member; and a support member disposed on the inner peripheral surface of the heat insulation member in parallel with an axial direction thereof, for supporting the heating resistor at predetermined pitches along the axial direction; the method comprising the steps of: preparing: a helical heating resistor having a plurality of terminal plates arranged along an axial direction; a support member including tubular members passing through spaces between adjacent portions of the heating resistor so as to be radially positioned; and a jig that arranges the support member in a position in a circumferential direction of the heating resistor so as to axially align the support member; placing the heating resistor on the jig through the support member while rotating the jig; disposing a filter member on an outer periphery of the heating resistor excluding the terminal plates and the support pieces of the support member, and circumferentially disposing on the filter member narrow rod members at suitable intervals therebetween along an axial direction of the heating resistor; immersing the heating resistor into a suspension containing inorganic fibers constituting a heat insulation material, and depositing the heat insulation material on the filter member by a suction from an inside of the heating resistor; drying the heat insulation material deposited on the filter member so as to form a heat insulation member; pulling out the rod members from between the heat insulation member and the filter member after the drying step, and further pulling out the filter member from between the heat insulation member and the heating resistor; and removing the jig from the support member.

According to the present invention, since a frictional resistance, which is generated between a support member and a heating resistor when the heating resistor is thermally expanded and thermally shrunk, can be reduced, generation of a permanent deformation of the heating resistor caused by a residual stress thereof can be restrained, to thereby improve the durability.

BEST MODE FOR CARRYING OUT THE INVENTION

Figure 1:
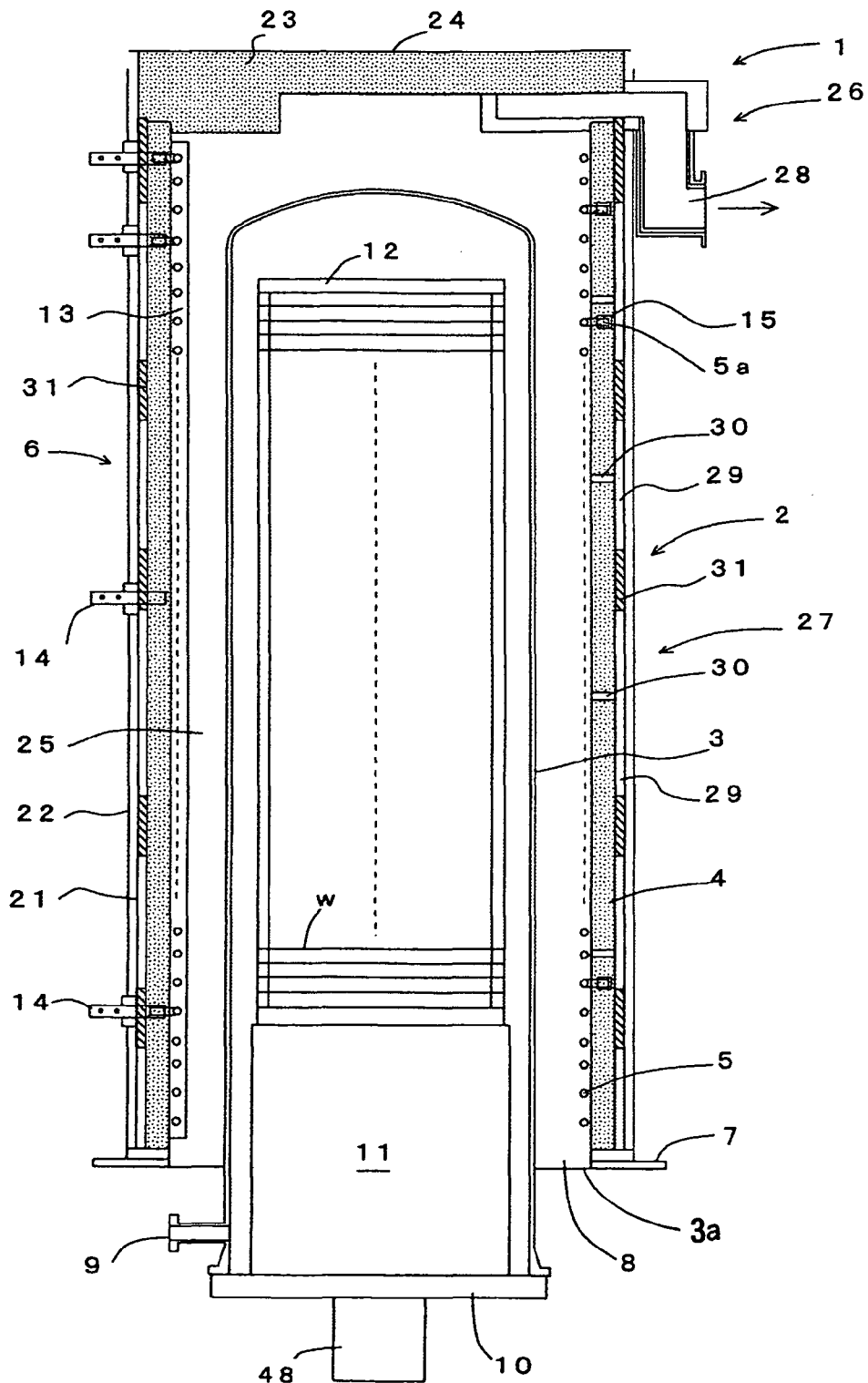
FIG. 1 is a longitudinal sectional view of a heat processing furnace schematically showing an embodiment of the present invention.
Figure 2:
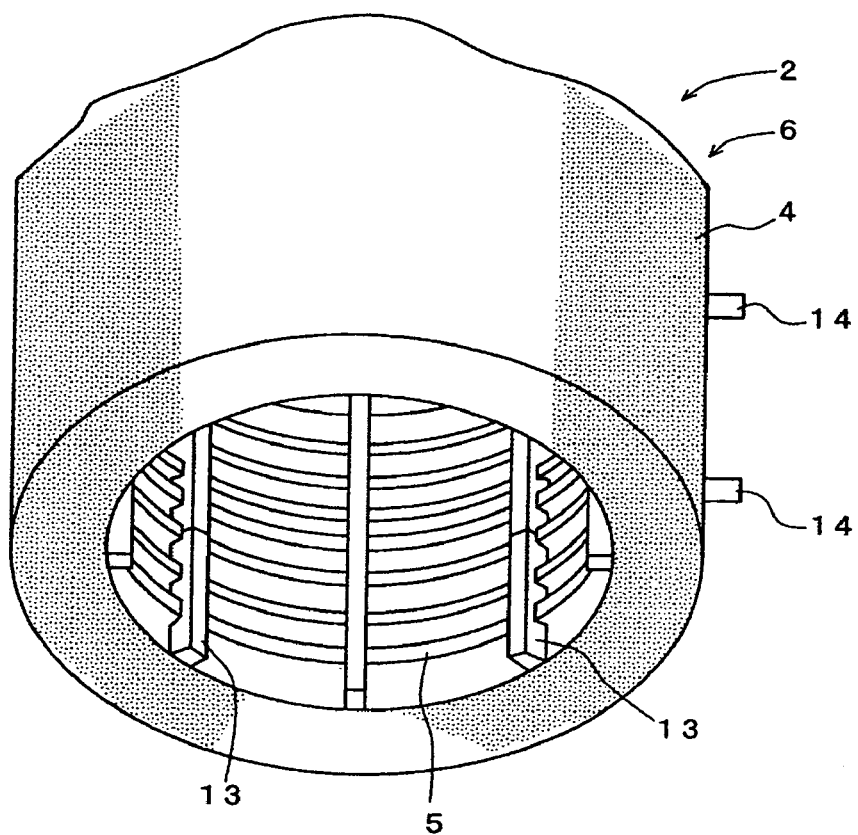
FIG. 2 is a perspective view partially showing the heat processing furnace.
Figure 3:
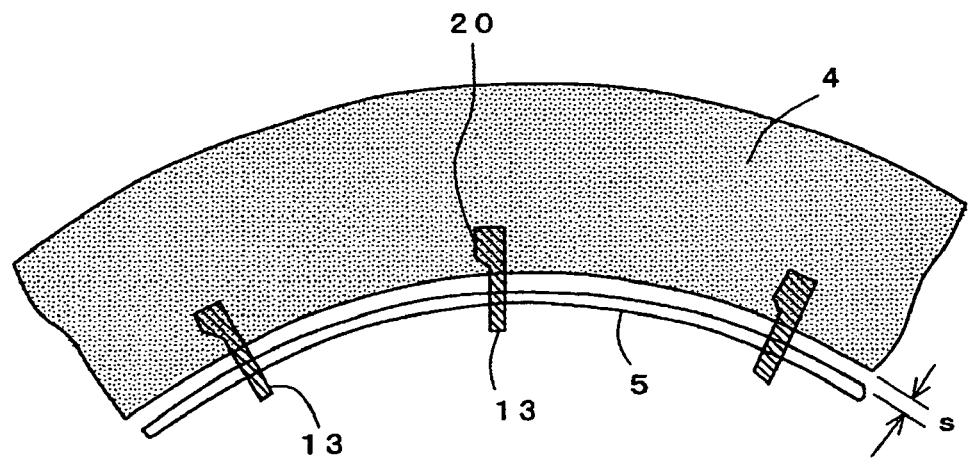
FIG. 3 is a partial cross-sectional view of the heat processing furnace.
Figure 4:
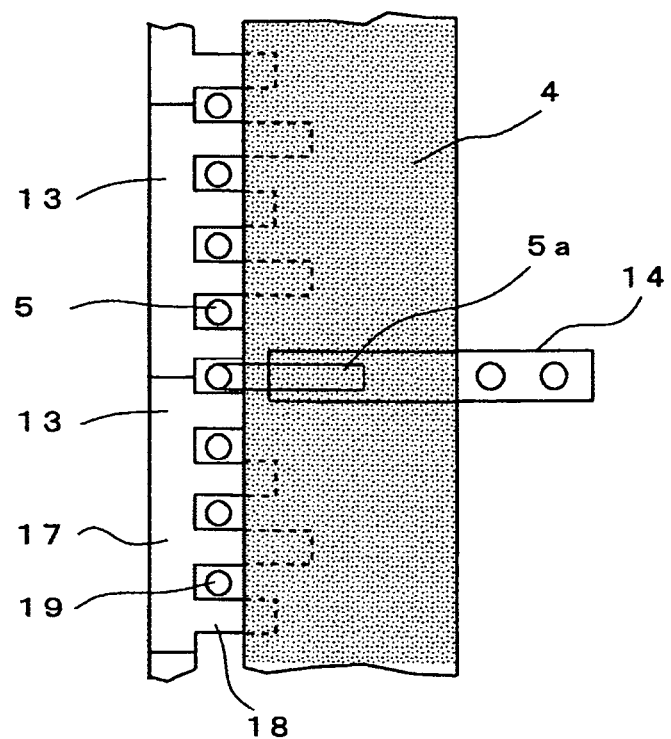
FIG. 4 is a partial longitudinal sectional view of the heat processing furnace.

The best mode for carrying out the invention will be described herebelow with reference to the accompanying drawings. FIG. 1 is a longitudinal sectional view schematically showing a heat processing furnace in one embodiment according to the present invention. FIG. 2 is a perspective view partially showing the heat processing furnace. FIG. 3 is a partial cross-sectional view of the heat processing furnace. FIG. 4 is a partial longitudinal sectional view of the heat processing furnace.

In FIG. 1, the reference number 1 shows a vertical heat processing apparatus which is one of semiconductor manufacturing apparatuses. The heat processing apparatus 1 is formed of a vertical heat processing furnace 2 capable of simultaneously accommodating a number of objects to be processed, such as semiconductor wafers w, and performing a heat process such as an oxidation process, a diffusion process, and a low pressure CVD process. The heat processing furnace 2 includes a processing vessel (also referred to as "reaction tube") 3 capable of simultaneously accommodating wafers w in a tier-like manner and subjecting thereto a predetermined heat process, a cylindrical heat insulation member 4 surrounding the processing vessel 3, and a helical heating resistor (also referred to as "heating wire") 5 arranged along an inner peripheral surface of the heat insulation member 4. In this case, the heat insulation member 4 and the heating resistor constitute a heater (heating apparatus) 6. In the following description about a method of manufacturing the heat processing furnace 2, a method of manufacturing the heater 6 is particularly described.

The heat processing apparatus 1 is provided with a base plate 7 for placing thereon the heater 6. Formed in the base plate 7 is an opening 8 through which the processing vessel 3 can be inserted upward from below. The opening 8 has a heat insulation member, not shown, for covering a gap between the base plate 7 and the processing vessel 3.

The processing vessel 3, which is also referred to as "process tube", is made of quartz, and is formed to have an elongated cylindrical shape, with its upper end being closed while its lower end being opened. An outward flange 3a is formed at the open end of the processing vessel 3. The flange 3a is supported on the base plate 7 through a flange presser, not shown. The illustrated processing vessel 3 is equipped, in a lower part thereof, with an inlet port 9 through which a process gas and an inert gas are introduced to the processing vessel 3, and an outlet port, not shown, through which a gas in the processing vessel 3 is discharged. A gas supply source is connected to the inlet port 9. Connected to the outlet port is an exhaust system having a vacuum pump capable of reducing a pressure to, e.g., about 10 Torr to $10^{-8}$ Torr.

Below the processing vessel 3, there is disposed a lid member 10 for closing the lower-end opening (furnace opening) of the processing vessel 3. The lid member 10 can be opened and closed in an up and down direction, and can be elevated by an elevating mechanism, not shown. A heat retention unit of the furnace opening, such as a heat retention tube 11, is located on an upper part of the lid member 10. Located on an upper part of the heat retention tube 11 is a quartz boat 12 as a holding member for holding a number of, e.g., about 100 to 150 wafers w each having a diameter of, e.g., 30 mm, at predetermined intervals therebetween in the up and down direction. The lid member 10 is provided with a rotational mechanism 53 that rotates the boat 12 about its axis. By the downward movement of the lid 10, the boat 12 is unloaded from the processing vessel 3 to a below loading area in which wafers w are replaced. After that, the boat 12 is loaded into the processing vessel 3 by the upward movement of the lid member 10.

Figure 5:
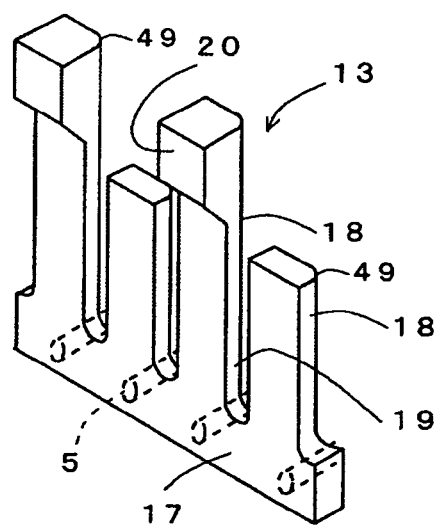
FIG. 5 is a perspective view showing a support member.
Figure 6:
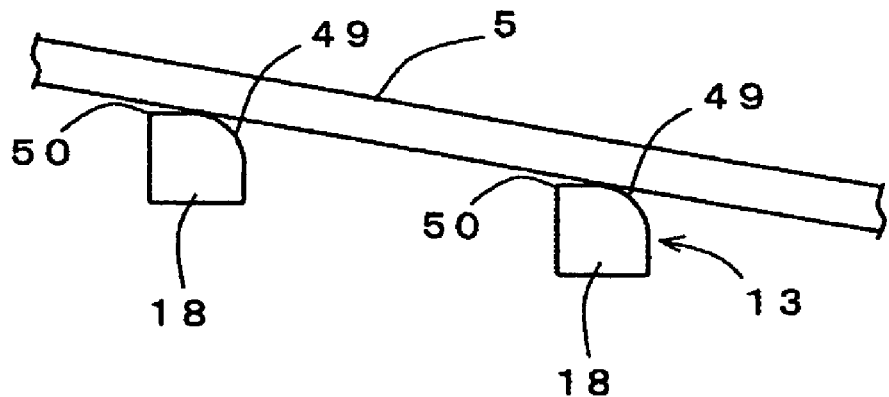
FIG. 6 is an explanation view for explaining a sectional shape of a support piece.
Figure 9:
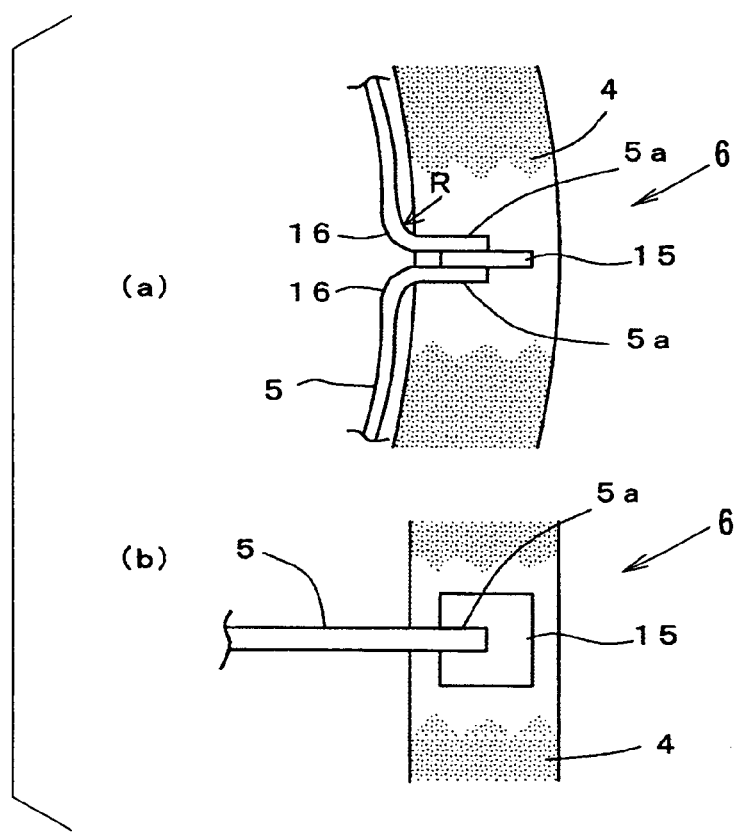
FIG. 9(a) is a plan view partially showing a fixing structure of a fixed plate in the heating resistor.
FIG. 9(b) is a lateral view partially showing the fixing structure of the fixed plate in the heating resistor.
Figure 10:
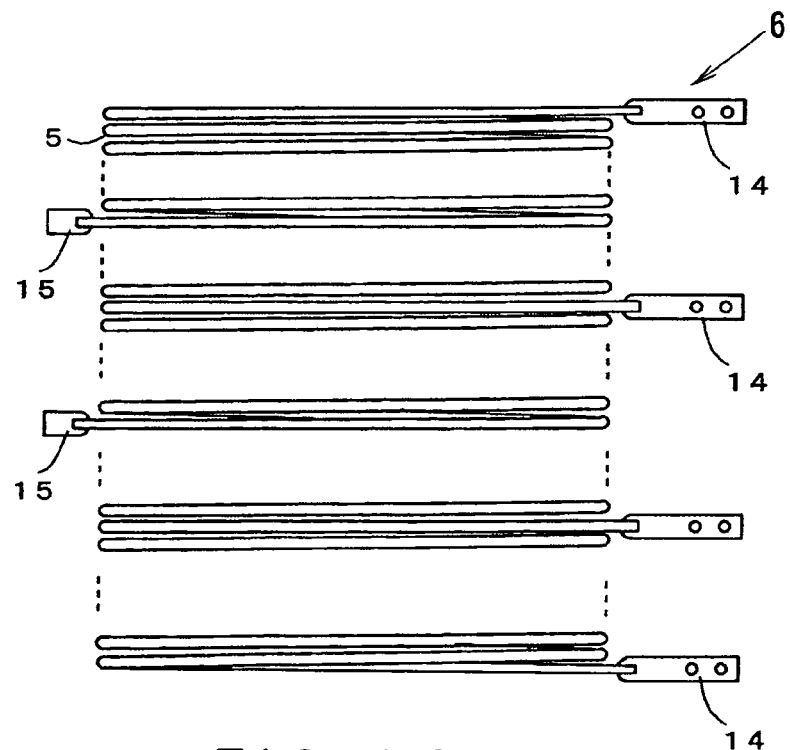
FIG. 10 is a lateral view schematically showing the heating resistor provided with the terminal plates and the fixed plates.

FIG. 5 is a perspective view showing a support member, and FIG. 6 is an explanation view for explaining a sectional shape of a support piece. As shown in FIGS. 2 to 4 and FIGS. 9 to 11, the heater 6 includes: the cylindrical heat insulation member 4; the helical heating resistor (element) 5 arranged along an inner periphery of the heat insulation member 4; a support member 13 axially disposed on the inner peripheral surface of the heat insulation member 4, for supporting the heating resistor 5 at predetermined pitches along the axial direction; and a plurality of terminal plates 14 arranged on an outside of the heating resistor 5 at suitable intervals therebetween, the terminal plates 14 radially passing through the heat insulation member 4 so as to be extended outside. As shown in FIGS. 9 and 10, the heater 6 is provided with a plurality of fixed plates 15 arranged on the outside of the heating resistor 5 at suitable intervals therebetween and fixed in the heat insulation member 4. The heating resistor 5 is formed of a kanthal wire which is made of an alloy wire containing, for example, iron (Fe), chrome (Cr), and aluminum (Al). Although the thickness of the heating resistor 5 differs depending on specifications of the heat processing furnace 2, there is used the heating resistor 5 having a diameter of about 3.5 mm or about 8.5 mm.

The helical heating resistor 5, which is vertically arranged, is fixed on the heat insulation member 4 via the terminal plates 14 for each zone, and is supported via the comb-shaped support member 13 such that the heating resistor 5 can be thermally expanded and thermally shrunk. Under this state, if the heating resistor 5 is elongated by a creep and/or a thermal expansion thereof, the elongation tends to be accumulated because of gravitation at a lower part of each zone. Thus, in order to prevent the elongation, which is caused by the creep and/or the thermal expansion, from being accumulated at the lower part of each zone because of gravitation, the fixed plates 15 are disposed on the heating resistor 5 at suitable turns or at division points where the zone is divided into a plurality of turns. Due to the fixed plates 15 and the terminal plates 14, the heating resistor 5 is fixed on the heat insulation member 4. As shown in FIG. 10, for example, each of the fixed plates 15 is suitably fixed on a turn between the adjacent terminal plates 14.

The heating resistor 5 formed to have a helical shape with a predetermined winding diameter and predetermined pitches, such that the heating resistor 5 is not in contact with the heat insulation member 4 when arranged along the inner wall surface of the heat insulation member 4. The terminal plates 14 to be connected to electrodes, which pass through the heat insulation member 4 so as to be extended outside, are arranged on the helical heating resistor 5 at suitable intervals therebetween in the axial direction of the heat insulation member 4. Thus, an inside of the processing vessel 3, i.e., an inside of the heat processing furnace 2 is divided into a plurality of zones in the up and down direction, and temperatures of the respective zones can be independently controlled. The terminal plate 14 is made of the same material as that of the heating resistor 5, and is formed to have a plate-like shape with a predetermined cross-sectional area, in view of preventing fusion of the terminal plate 14 and restraining heat release therefrom.

In order to fix the terminal plate 14 to the heating resistor 5, the heating resistor 5 is severed at an intermediate position thereof onto which the terminal plate 14 is fixed. Severed opposed ends 5a are bent outward in a radial direction of the heat insulation member 4, and the bent opposed ends 5a are secured by welding to opposed surfaces of the terminal plate 14. In particular, in order to mitigate a stress concentration to the welded and joined portion, bent portions 16 of the severed opposed ends 5a of the heating resistor 5 are bent by an R-bending process.

Figure 19:
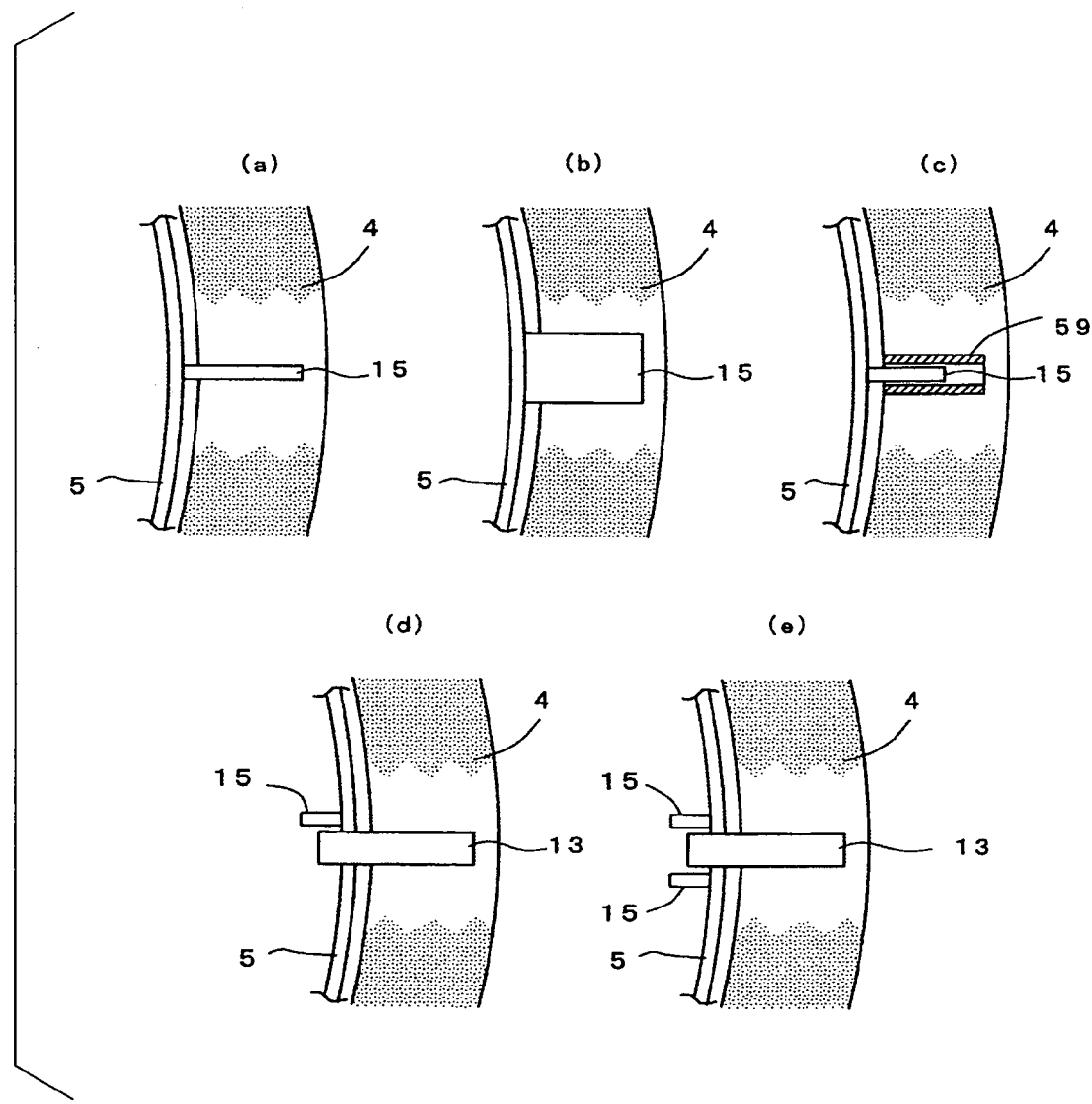
FIGS. 19(a) to 19(e) are explanation views showing other examples of the fixed plate.

The fixed plate 15 is made of the same material as that of the terminal plate 14, and has the same sectional shape, with a length thereof being shorter than that of the terminal plate 14. The fixed plate 15 is embedded (buried) in the heat insulation member 4, and does not project outside. The fixed plate 15 is fixed to the heating resistor 5 by the same fixing structure as that of the terminal plate 14. Namely, in order to fix the fixed plate 15, the heating resistor 5 is severed at an intermediate position thereof onto which the fixed plate 15 is fixed. Severed opposed ends 5a are bent outward in the radial direction of the heat insulation member 4, and the bent opposed ends 5a are secured by welding to opposed surfaces of the fixed plate 15. Bent portions 16 of the opposed ends 5a are bent by the R-bending process. FIGS. 19(a) to 19(e) respectively show other examples of the fixed plate (fixed means). FIG. 19(a) shows an example in which a fixed member 15 of a round-bar shape or a square-bar shape is disposed on an outer periphery of a heating resistor. FIG. 19(b) shows an example in which a fixed plate 15 of a flat-plate shape is disposed on an outer periphery of a heating resistor. FIG. 19(c) shows an example in which a fixed member 15 of a round-bar shape is disposed on an outer periphery of a heating resistor, and a cylindrical reception member 59 for slidably supporting the fixed member 15 is disposed. FIG. 19(d) shows an example in which a bar-shaped fixed member 15 is disposed on a heating resistor 5 at a position upstream of a support member 13. FIG. 19(e) shows an example in which bar-shaped fixed members 15 are disposed on a heating resistor 5 at a position upstream of a support member 13 and a position downstream thereof (the orientation of the fixed member is along a furnace-core direction, which is illustrated, or along an upward or downward direction).

The heating resistor 5 is fixed on the inside of the cylindrical heat insulation member 4 via the support member 13 made of a material, such as ceramics, having a heat resistant property and an electrically insulative property. In this case, the heating resistor 5 is disposed inside the heat insulation member 4 at arrangement pitches capable of ensuring a predetermined heat quantity, and is spaced apart from the inner wall surface of the heat insulation member 4 by a predetermined gap s, such that the heating resistor 5 can be thermally expanded and thermally shrunk. The support member 13 is divided in the axial direction of the heat insulation member 4. As shown in FIG. 5, each of the divided support members 13 includes a base part 17 positioned on an inside of the heating resistor 5, and a plurality of support pieces 18 extending radially outward from the base part 17 through the pitches between adjacent portions of the heating resistor 5, the base part 17 and the support pieces 18 integrally forming a comb-like shape. A groove 19 is formed between the adjacent support pieces 18. The heating resistor 5 is inserted into the grooves 19 so as to be thermally expandable and thermally shrinkable (movable in the radial direction and the circumferential direction of the helical), and the heating resistor 5 is loosely supported by the support member 13 at the predetermined pitches.

The support member 13 is fixed inside the heat insulation member 14 by embedding the distal ends of the support pieces 18 in the heat insulation member 14. In this case, in order to improve a fixing strength so as to avoid falling of the support member 13 from the heat insulation member 4, it is preferable that the distal end of the support piece 18 is formed to have a suitable length and that an enlarged portion or a projection 20 is formed at the distal end. The support members 13 are linearly positioned along the axial direction of the heat insulation member 4 at predetermined circumferential intervals, e.g., at intervals of 30 degrees, with the distal ends of the support pieces 18 being embedded in the heat insulation member 4.

Figure 7:
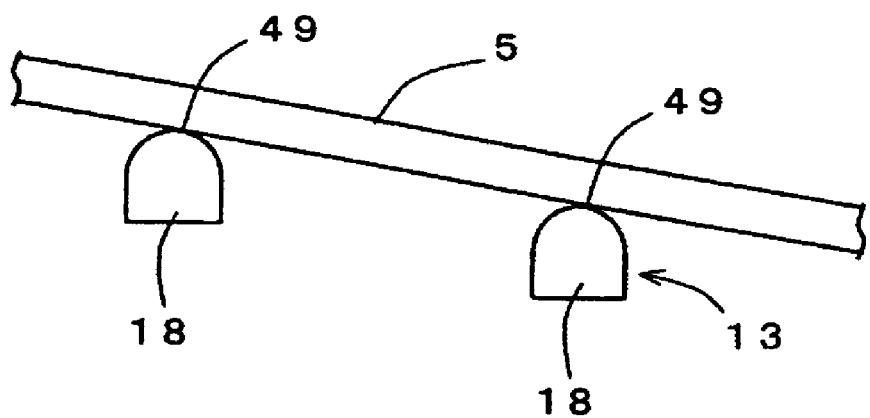
FIG. 7 is an explanation view for explaining another sectional shape of the support piece.
Figure 8:
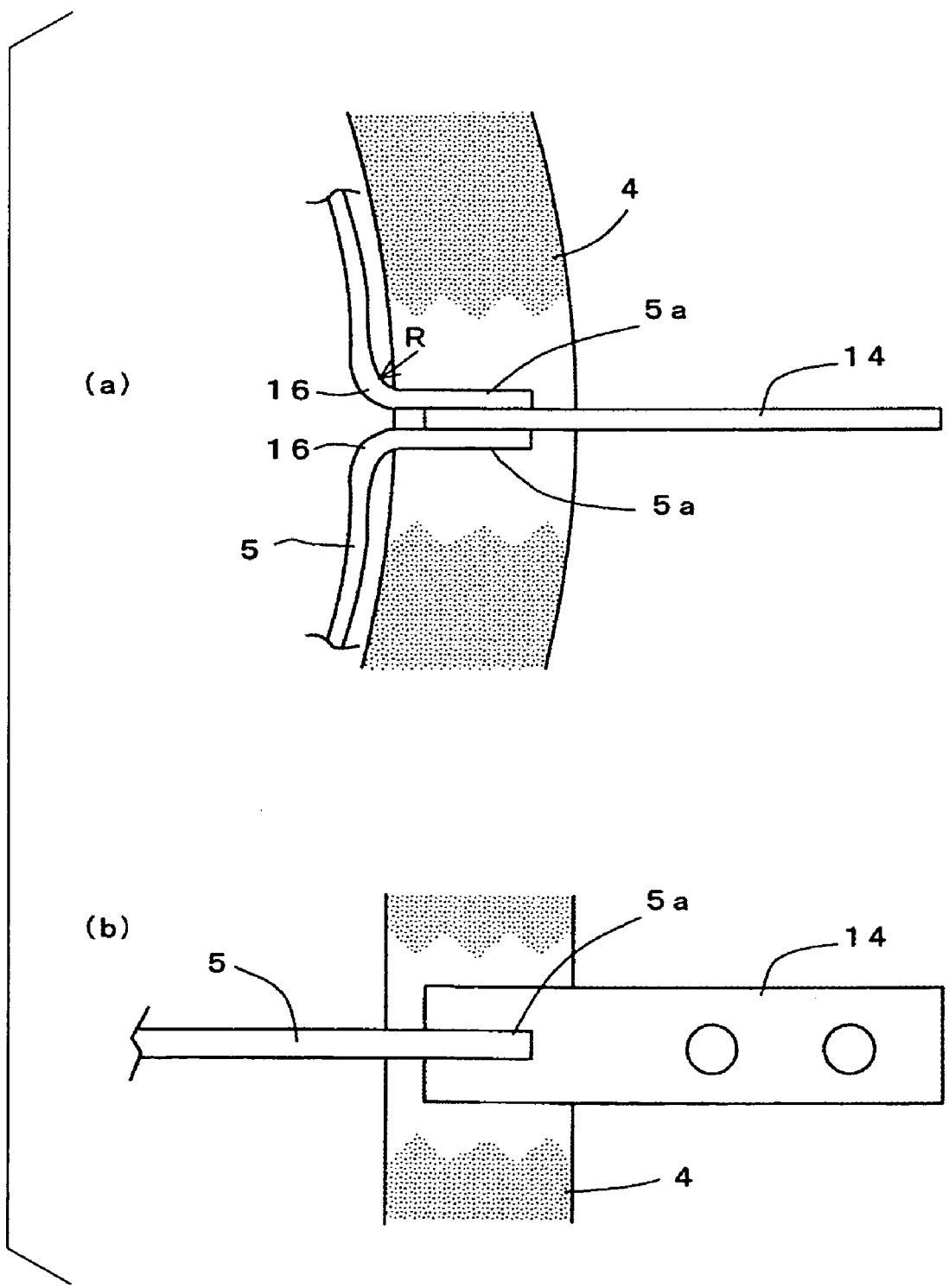
FIG. 8(a) is a plan view partially showing a fixing structure of a terminal plate in the heating resistor.
FIG. 8(b) is a lateral view partially showing the fixing structure of the terminal plate in the heating resistor.
Figure 20:
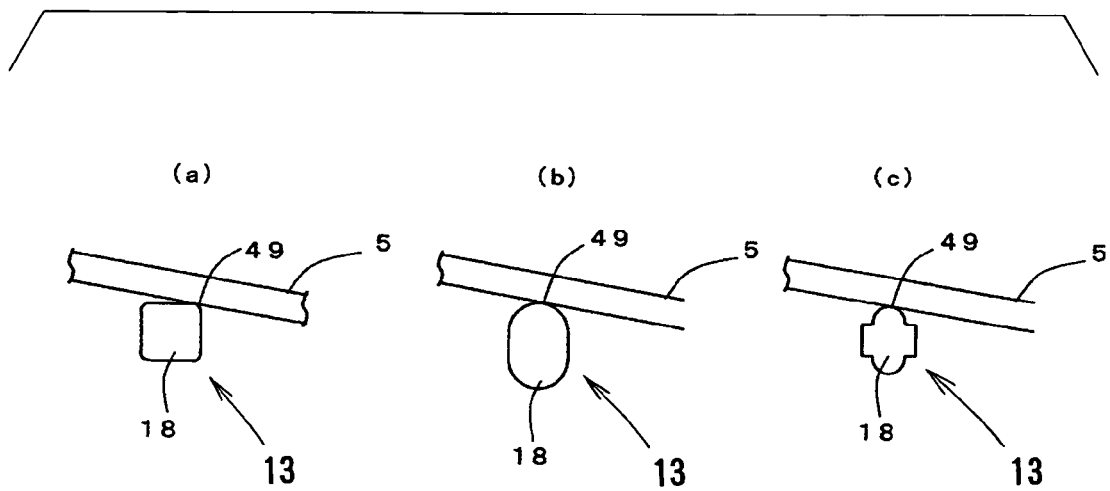
FIGS. 20(a) to 20(c) are explanation views showing other examples of the sectional shape of the support piece.
Figure 21:
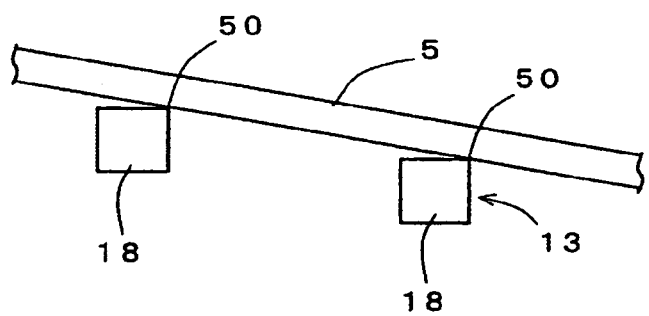
FIG. 21 is an explanation view for explaining a sectional shape of a support member in a conventional heat processing apparatus.

As shown in FIG. 6, with a view to reducing a frictional resistance generated when the heating resistor 5 is moved upon the thermal expansion and the thermal shrinkage, an upper surface part of each of the support pieces 18 of the support member 13 is formed to have a curved or a chamfered shape. The curvilinearly formed portion (upper curved portion) is shown by the reference number 49. To be specific, each of the support pieces 18 is preferably formed to have a rectangular cross-section, with at least one of corner portions of the upper surface part of the support piece 18, with which corner portion the helically inclined heating resistor 5 is in contact, (e.g., a right corner portion when the heating resistor 5 is inclined downward from the left side to the right side) being formed to have a curved shape to serve as the upper curved portion 49. In FIG. 6, not only the right corner portion of the support piece 18 of the support member 13, but also a left corner portion 50 may be formed to have a curved shape. Alternatively, as shown in FIG. 7, it is preferable that the overall upper surface part of the support piece 18 is formed to have a curved shape. In addition, as shown in FIG. 20(a), 20(b), and 20(c), it is more preferable that, not only the upper surface, but also a lower surface of the support piece 18 of the support member 13 has an R-shape or a curved shape 49. The curved portion 49 of the support piece 18 is formed by using a molding die before the ceramics is not burned yet, or is formed by a machining process after the ceramics has been burned.

In order to maintain the shape of the heat insulation member 4 as well as to reinforce the same, as shown in FIG. 1, an outer periphery of the heat insulation member 4 is covered with a metal or stainless outer shell 21. In addition, in order to restrain a thermal influence on the outside of the heater, an outer periphery of the outer shell 21 is covered with a water-cooling jacket 22. An upper heat-insulation member 23 is disposed on a top part of the heat insulation member 4 so as to cover the same. A stainless top plate 24 is disposed on an upper part of the upper heat-insulation member 23 so as to cover a top part (upper end part) of the outer shell 21.

In order to accelerate a process or improve throughput by rapidly decreasing a temperature of a wafer after it has been heat-processed, the heater 6 is equipped with a heat exhaust system 26 that discharges an atmosphere in a space 25 between the heater 6 and the processing vessel 3 to the outside, and a cooling unit 27 that forcibly cools the space 25 by introducing thereinto a cooling fluid (e.g., air). The heat exhaust system 26 is composed of, for example, an outlet port 28 formed in an upper part of the heater 6, and a heat exhaust pipe, not shown, that connects the outlet port 28 and a factory exhaust system, not shown. The heat exhaust pipe has an exhaust blower and a heat exchanger, not shown.

The cooling unit 27 includes a plurality of annular passages 29 formed between the heat insulation member 4 and the outer shell 21 in a height direction, and blow holes 30 formed in the heat insulation member 4 such that a cooling fluid is blown out from the respective annular passages 29 toward a center of the heat insulation member 4 in a horizontal direction or an inclined direction so as to generate an air flow in the space 25 or a whirl flow in the space 25 in a circumferential direction thereof. The annular passages 29 are formed by attaching strip-like or annular heat insulation members 31 to the outer periphery of the heat insulation member 4, or by annularly scraping the outer periphery of the heat insulation member 4.

A single common supply duct, not shown, for dispensing a cooling fluid to the respective annular passages 29 is disposed on an outer surface of the outer shell 21 in the height direction. The outer shell 21 has communication ports that communicate an inside of the supply duct and the respective annular passages 29. Connected through an on-off valve to the supply duct is a cooling-fluid supply source (e.g., ventilator), not shown, that sucks an air in a clean room as a cooling fluid and supplies the air by means of a pressure.

According to the heat processing furnace 2 as structured above, the support member 13 includes the base part 17 positioned on the inside of the heating resistor 5, and the plurality of support pieces 18 extending outward from the base part 17 in the radial direction of the furnace through spaces between the pitches of the heating resistor 5, the support member being formed to have a comb-like shape. The upper surface part of each of the support pieces 18 (at least one of the corner portions of the upper surface part of the supporting piece 18, with which corner portion the helically inclined heating resistor 5 is in contact) is formed to have a curved shape (R-processed) in order to reduce a frictional resistance generated when the heating resistor 5 is moved upon the thermal expansion and the thermal shrinkage. Therefore, the frictional resistance, which is generated between the support member 13 and the heating resistor 5 when the heating resistor 5 is thermally expanded and thermally shrunk, can be reduced, whereby generation of a permanent deformation of the heating resistor 5 caused by a residual stress thereof can be restrained, to thereby improve the durability. In particular, when the heating resistor 5 is heated to be thermally expanded and then cooled to be thermally shrunk so that a frictional force is generated between the support member 13 and the heating resistor 5, it is possible to restrain promotion of a permanent elongation of the heating resistor 5 by a residual stress thereof caused by the frictional resistance, to thereby improve the durability.

According to the above heat processing furnace 2, there are arranged the plurality of fixed plates 15 at suitable intervals on the outside of the heating resistor 5 and fixed in the heat insulation member, the fixed plate 15 being fixed on the heating resistor 5 by the same fixing structure as that of the terminal plate 14. Thus, increase in temperature of the joined part of the fixed plate 15 and concentration of stress thereon can be restrained, and the fixed plate 15 is resistant to be fallen from the heat insulation member 4 to provide an excellent maintainability, whereby the durability of the heat processing furnace 2 including the heating resistor 5 can be improved. Since the heating resistor 5 is fixed on the heat insulation member 4 by the fixed plates 15 at suitable turns, separately from the support member 13 and the terminal plates 14, it is possible to prevent that elongation of the heating resistor 5 by a creep and a thermal expansion is accumulated to one end side. Since it can be prevented that the winding diameter of the one end side of the heating resistor 5 is increased to come into contact with the inner peripheral surface of the heat insulation member 4, there is no possibility that deformation such as buckling or breakage of the heating resistor 5 occurs, whereby the durability of the heating resistor 5 can be improved.

Figure 11:
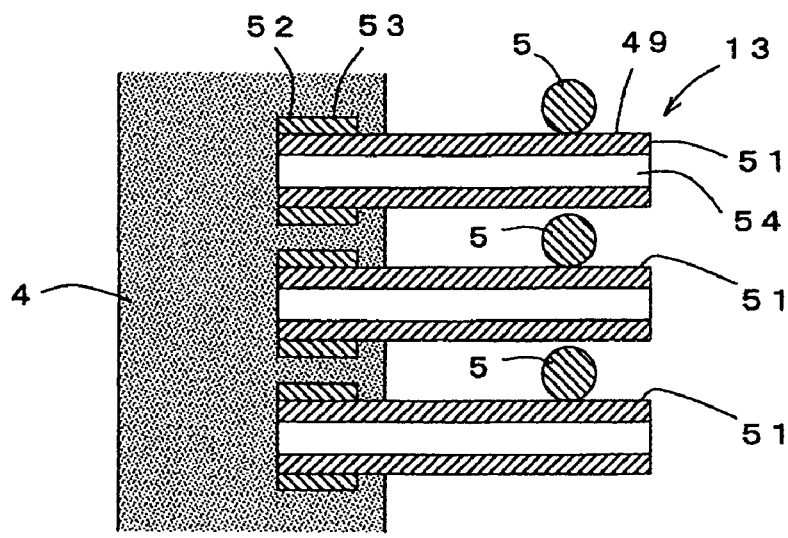
FIG. 11 is a cross-sectional view schematically showing another example of the support member.

FIG. 11 is a cross-sectional view schematically showing another example of the support member. In the embodiment shown in FIG. 11, the same parts as those of the embodiment shown in FIG. 4 are shown by the same reference numbers and detailed description thereof is omitted. In the embodiment shown in FIG. 11, a support member 13 is formed of a plurality of tubular members (pipes) 51 each having one end being embedded in a heat insulation member 4 and the other end projecting radially inward in a horizontal or substantially horizontal direction. The heating resistor 5 is placed on and supported by curved upper surface parts (upper curved portions 49) of the tubular members 51. Preferably, the tubular member 51 is made of ceramics, and is provided with, on the one end (proximal end) to be embedded in the heat insulation member 4, an enlarged-diameter part 52 for preventing falling of the tubular member 51 from the heat insulation member 4. The enlarged-diameter part 52 is formed by fixing, to one end of the tubular member 51, a circular member 53 that is somewhat larger than the tubular member 51.

Figure 13:
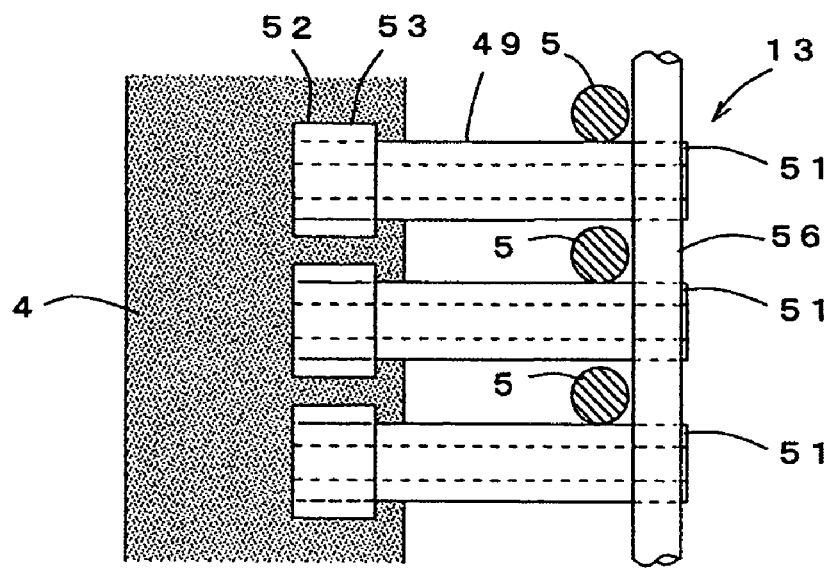
FIG. 13 is a cross-sectional view schematically showing another example of the support member.
Figure 14:
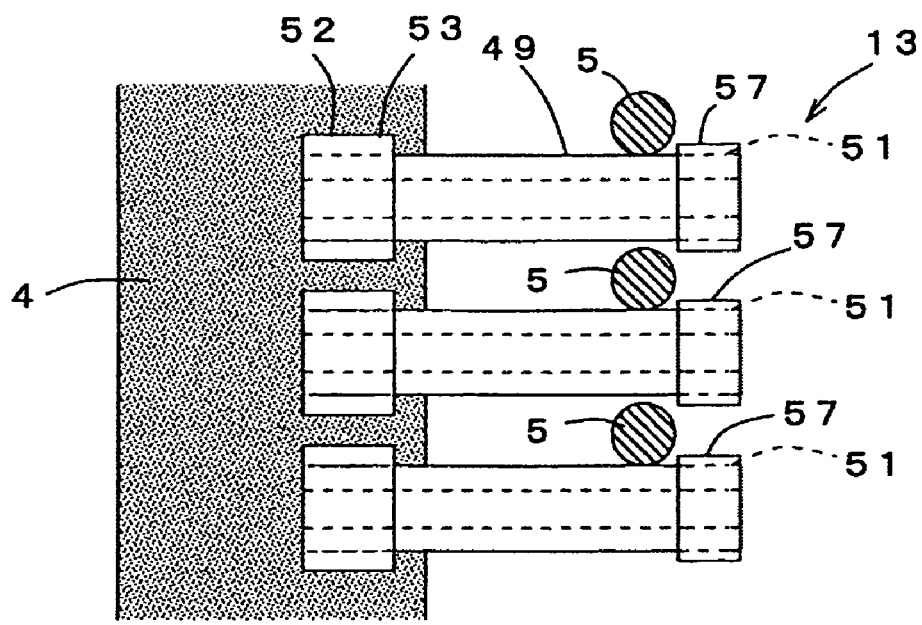
FIG. 14 is a cross-sectional view schematically showing another example of the support member.

In order to reduce a heat capacity of the tubular member 51 so that a temperature can be rapidly increased and decreased, it is preferable that a hollow shaft hole 54 of the tubular member 51 is not filled with an heat insulation member. In addition, it is preferable that a linear member 55, which is means (stopper) for preventing falling of the heating resistor, is disposed between distal ends (inner ends) of the tubular members 51 which are adjacent to each other in the up and down direction, and the linear member 55 passes through the shaft holes 54 of the upper and the lower tubular members 51, with opposed ends 55*a* of the linear member 55 being embedded in the heat insulation member 4 so as to be fixed therein. A material of the linear member 55 is preferably the same as that of the heating resistor 5. As the means for preventing the falling of the heating resistor 5, as shown in FIG. 13, a support column 56 bridging the distal ends (inner end s) of the tubular members 51 in the up and down direction may be disposed. Alternatively, as shown in FIG. 14, circular members 57 may be fixed to the distal ends (inner ends) of the tubular members 51.

According to the heat processing furnace 2 having the tubular members 51 as structured above, the support member 13 is formed of the plurality of tubular members 51 each having one end being embedded in the heat insulation member 4, and the other end projecting radially inward. The heating resistor 5 is supported on the curved upper surface of the tubular member 51. Thus, Thus, it is possible to reduce a frictional resistance which is generated between the support member 13 and the heating resistor 5 when the heating resistor 5 is thermally expanded or thermally shrunk, whereby generation of a permanent deformation caused by a residual stress of the heating resistor 5 can be restrained, and the durability thereof can be improved.

Figure 15:
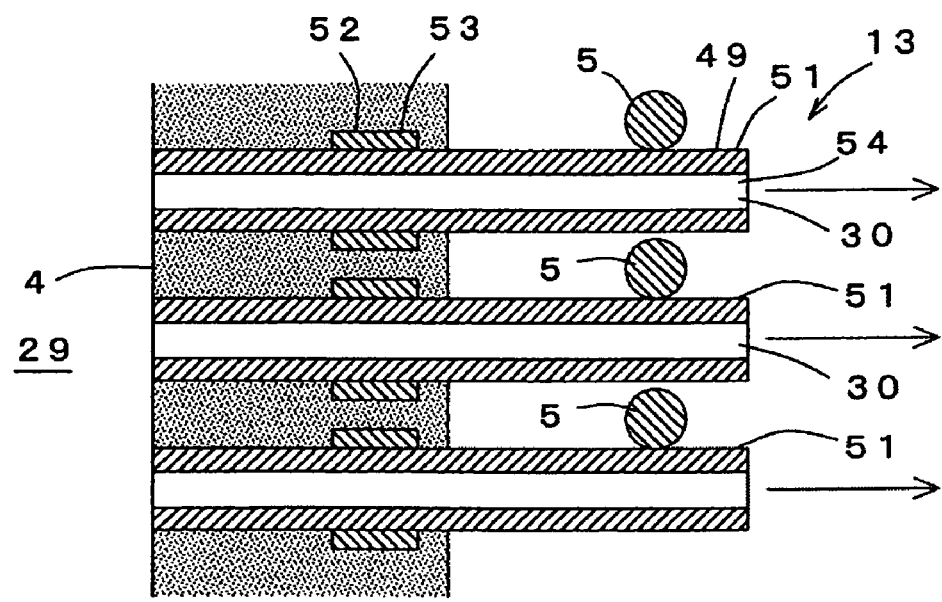
FIG. 15 is a cross-sectional view schematically showing another example of the support member.

As shown in FIG. 15, the tubular member 51 may be structured as a blowing nozzle that blows a cooling fluid, e.g., an air of a room temperature, so as to forcibly cool the inside of the heat processing furnace 2. Namely, the shaft hole 54 of the tubular member 51 functions as a blowing hole 30 through which a cooling fluid is blown. One end of the tubular member 51 passes through the heat insulation member 4 so as to be communicated with the annular passage 29. According to the heat processing furnace having the tubular members 51 as structured above, since the forcible air cooling operation can be performed by using the tubular members 51, it is not necessary to additionally form blowing holes. Thus, the structure can be simplified, as well as a cooling fluid can be effectively blown onto the processing vessel 3 without interference of the heating resistor 5, since each of the tubular members 51 extends through a space between the portions of the heating resistor 5, which are adjacent to each other in the up and down direction.

Figure 12:
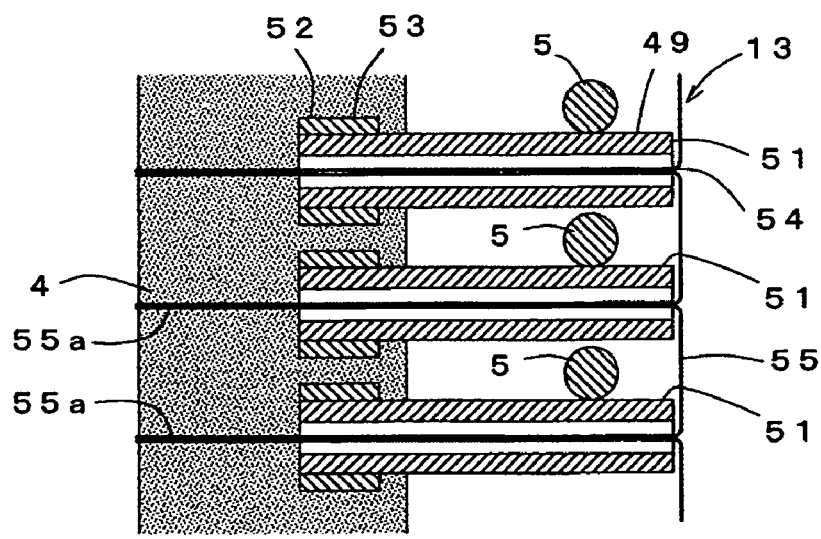
FIG. 12 is a cross-sectional view schematically showing another example of the support member.
Figure 16:
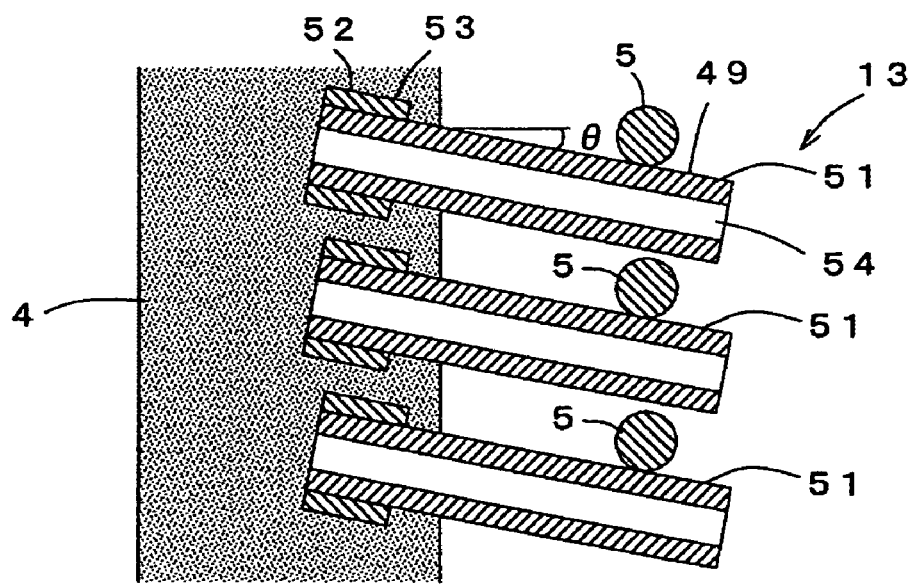
FIG. 16 is a cross-sectional view schematically showing another example of the support member.

FIG. 16 is a cross-sectional view schematically showing another example of the support member. In the embodiment shown in FIG. 16, the same parts as those of the above embodiment are shown by the same reference numbers and detailed description thereof is omitted. Tubular members 51 in the embodiment shown in FIG. 16 forming a support member 13 of a heater of a heat processing furnace are located such that distal end sides (inner end sides) thereof are inclined downward. An inclination angle θ of the tubular member 51 is preferably between about 50° and 200°. By locating the tubular member 51 such that the distal end side thereof is inclined downward, when a helical heating resistor 5 is cooled to be shrunk, the heating resistor 5 can be easily moved radially inward with its diameter being reduced, while the heating resistor 5 is slid along the inclined upper surface of the tubular member 51. Thus, a tensile stress upon the thermal shrinkage can be reduced, so that a permanent elongation of the heating resistor 5 can be restrained, to thereby further improve the durability. Also in the heater of the heat processing furnace in this embodiment, the tubular member 51 may have the structure as shown in FIG. 12 (there is provided the linear members for preventing the falling of the heating resistor), the structure as shown in FIG. 13 (there is provided the support column for preventing the falling of the heating resistor), the structure as shown in FIG. 14 (there is provided the annular members for preventing the falling of the heating resistor), or the structure as shown in FIG. 15 (the tubular member is structured as the blowing nozzle for a forcible cooling operation).

Figure 17:
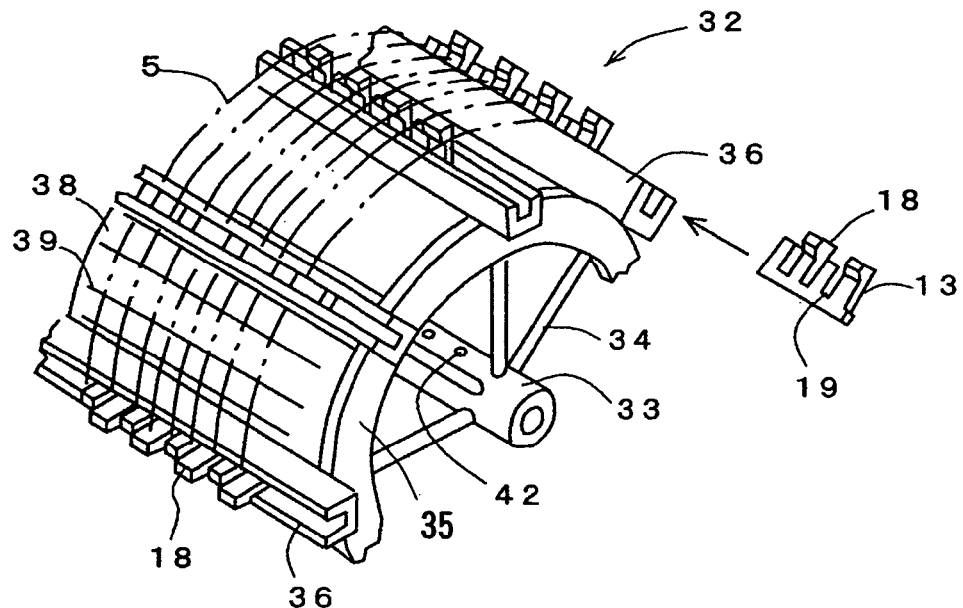
FIG. 17 is a perspective view for explaining a structure of a jig used in a method of manufacturing a heat processing furnace to which the present invention is applied.
Figure 18:
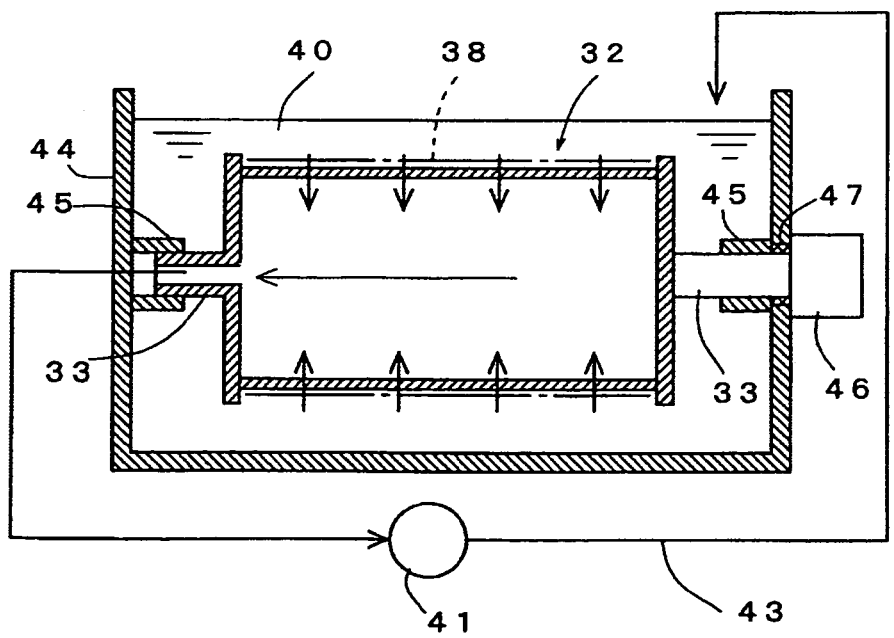
FIG. 18 is a schematic view for explaining a step of depositing a heat insulation member on a filter member in the method of manufacturing a heat processing furnace according to the present invention.

Next, an example of a method of manufacturing the heat processing furnace, specifically, the heater 6 is described with reference to FIGS. 17 and 18. FIG. 17 is a perspective view for explaining a structure of a jig used in a method of manufacturing a heat processing furnace to which the present invention is applied. FIG. 18 is a schematic view for explaining a step of depositing a heat insulation member on a filter member in the method of manufacturing a heat processing furnace according to the present invention.

At first, there are prepared a heating resistor 5 that has been helically molded beforehand and provided with terminal plates 14 and fixed plates 15, a support member 13 for supporting the heating resistor 5, and a drum-shaped jig 32 for supporting the support member 13. The support member 13 includes a plurality of support pieces 18 and is formed to have a comb-like shape. An upper surface part of each of the support pieces 18 is formed to have a curved shape so as to reduce a frictional resistance generated when the heating resistor 5 is moved upon a thermal expansion and a thermal shrinkage thereof. The support member 13 may be formed of tubular members 51 passing through spaces between pitches of the heating resistor 5 so as to be positioned in a radial direction of a furnace. The jig 32 includes a hollow support shaft 33, and a plurality of circular base plates 35 axially disposed on the support shaft 33 at suitable intervals therebetween via a radial spoke 34, the jig 32 being formed to have a drum-like shape. Disposed axially on outer peripheries of the base plates 35 are guide members 36 each having a U-shaped cross-section opening outward. In this case, the guide members 36 are extended over the base plates 35 by means of grooves formed therein, and are positioned at circumferentially equal intervals. The support members 13 are serially fitted in the guide members 36 of the jig 32. In addition, a plurality of suction holes 42 are formed in a circumference of the support shaft 33. While the jig 32 as structured above is being rotated, the helical heating resistor 5 is helically wound and placed on the jig 32 from one end thereof, such that the heating resistor 5 passes through spaces between the grooves 19 formed between the support pieces 18 or spaces between the tubular members of the support member 13.

Then, a meshed filter member 38 is disposed over an outside of the heating resistor 5 on the jig 32, excluding the terminal plates 14, the fixed plates 15, and the support pieces 18 of the support member 13. Thereafter, narrow rod members 39 are positioned on the filter member 38 along the axial direction of the heating resistor 5 at suitable circumferential intervals. The filter member 38 is preferably a fine-meshed member made of aluminum, for example. The rod member 39 is preferably a stainless-steel round rod having a diameter of, e.g., about 1 mm to 2 mm. The filter member 38 is disposed with a predetermined thickness on the overall outer peripheral surface of the heating resistor 5 excluding the support pieces 18, the terminal plates 14, and the fixed plates 15, such that the filter member 38 can be pulled out from the axial direction. The rod members 39 are positioned on the filter member 38 and are fixed thereon by threads or rubber rings.

The jig 32 is immersed into a suspension 40 containing inorganic fibers as a heat insulation material, and the heat insulation material is sucked from an inside of the jig 32 so as to be deposited on the filter member 38. In this case, by rotating the jig 32, the suspension 40 of the heat insulation material can be stirred, and the heat insulation material can be deposited on the filter member 38 with a uniform thickness. The suspension 40 is preferably a slurry consisting of inorganic fibers containing, e.g., silica, alumina, or aluminum silicate, a water, and a binder.

By connecting a suction pump 41 to the hollow support shaft 33 of the jig 32, a pressure inside the heating resistor 5 is decreased through the suction holes 42 of the support shaft 33. Then, the suspension 40 is drawn to a surface of the filter member 38, so that the fibrous component, which is the heat insulation material that does not transmit the filter member 38, is laminated on the filter member 38. A moisture and the fibrous component transmitting the filter member 38 are collected through a discharge pipe 43 of the suction pump 41. Alternatively, the moisture and the fibrous component may be re-supplied into a suspension tank 44.

In this case, by rotating the jig 32 through the support shaft 33, the suspension 40 in the suspension tank 44 can be stirred, and the heat insulation material can be deposited on the filter member 38 with a uniform thickness. The jig 32 may be rotated by driving a motor 46 connected to one end of the support shaft 33 fitted in a bearing 45. At this time, it is preferable to dispose an air-tight seal member 47 between the suspension tank 44 and the support shaft 33, so as to prevent leakage of the liquid from the suspension tank 44. At this step, the heat insulation member 4 of a desired layer-thickness is formed, and the distal ends of the support pieces 18 of the support member 13, the terminal plates 14, and the fixed plates 15 are embedded in the heat insulation member 4.

Then, the jig 32 is taken out from the suspension 40, and the heat insulation material deposited on the filter member 38 is naturally or forcibly dried, whereby the cylindrical heat insulation member 4 is obtained. After the drying step, the rod members 39 are pulled out between the heat insulation member 4 and the filter member 38 along the axial direction, and the filter member 38 is pulled out between the heat insulation member 4 and the heating resistor 5. Since the rod member 39 has a small diameter and thus a contact surface area between the rod member 39 and the heat insulation member 4 is small, the rod member 39 can be easily pulled out. In addition, by pulling out the rod members 39, there is formed a slight gap between the heat insulation member 4 and the filter member 38. Thus, the filter member 38 can be relatively easily pulled out. By pulling out the filter member 38, there is formed a gap s (corresponding to the thicknesses of the filter member 38 and the rod member 39) between the heat insulation member 4 and the heating resistor 5. Due to the gap s, when the heating resistor 5 is thermally expanded, displacement in the radially outward direction of the heating resistor 5 can be allowed.

By pulling out the jig 32 supporting the support members 13 along the axial direction of the heat insulation member 4, the jig 32 is removed from the support members 13. Then, the heat insulation member 4 is subjected to a surface treatment or the like, there is obtained the heat processing furnace 2, i.e., the heater 6, in which the heating resistor 5 is placed on the inner wall surface of the cylindrical heat insulation member 4 through the support members 13.

According to the method of manufacturing the heat processing furnace 2 including such steps, it is possible to reduce a frictional resistance which is generated between the support member 13 and the heating resistor 5 when the heating resistor 5 is thermally expanded or thermally shrunk, so as to restrain generation of a permanent deformation of the heating resistor 5 caused by a residual stress thereof, whereby the heat processing furnace 2 having an excellent durability can be obtained. In addition, increase in temperature of the joined part of the fixed plate 15 and concentration of stress thereon can be restrained, and the fixed plate 15 is resistant to be fallen from the heat insulation member 4 to provide an excellent maintainability, whereby there can be obtained the heat processing furnace 2 including the heating resistor having an excellent durability. Further, the heating resistor 5 has been helically formed in advance. The support members 13 each having the base part 17 positioned on the inside of the heating resistor 5 and the plurality of support pieces 18 extending radially outward through the spaces between the pitches of the heating resistor 5, and the jig 32 that arranges the support members 13 in position in the circumferential direction of the heating resistor 5 so as to axially align the support members 13 are used, and therefore the heating resistor 5 is placed on the jig 32 while it is being rotated through the support members 13. Therefore, the work of helically winding the heating resistor 5 on the jig 32 can be saved. At the same time, since the arrangement pitches of the heating resistor 5 can be automatically set by the support pieces 18 or the tubular members of the support member 13, the arrangement work can be saved while precision of the arrangement pitches can be improved.

In the present invention, when the heat insulation member 4 is disposed outside the heating resistor 5, the heat insulation material can be simply deposited on the outside of the heating resistor 5 through the filter member 38 only by the suction from the inside of the heating resistor 5 immersed in the suspension 40. Namely, an operation for assembling a molding frame and an operation for releasing the same are not necessary. In addition, since only the drying step is required to obtain the heat insulation member 4 and a burning step is dispensable, the heat insulation member 4 can be formed in a short period of time. Furthermore, when the filter member 38 interposed between the heating resistor 5 and the heat insulation member 4 is pulled out after the molding step, a gap is defined between the filter member 38 and the heat insulation member 4 by pulling out the rod members 39 interposed between the filter member 38 and the heat insulation member 4. Moreover, since a plate surface of the terminal plate 14 is positioned in the axial direction of the heat insulation member 4 so as to restrain engagement of the filter member 38 with the terminal plate 14, the filter member 38 can be easily pulled out from the heat insulation member 4. For the reason as described above, there can be achieved improvement in workability and reduction in manufacturing period in the manufacture of the heat processing furnace 3. Simultaneously therewith, the positioning precision of the arrangement pitches of the heating resistor 5 can be improved.

The present invention is not limited to the above embodiments, and various modifications and changes are possible without departing from the scope of the present invention. For example, connected to a lower end of the processing vessel may be a cylindrical manifold made of a heat resistive metal, such as stainless steel, having an inlet pipe part and an outlet pipe part. In addition, the processing vessel may be of a dual tube structure.

What is claimed is:

1. A heat processing furnace comprising:
 a processing vessel capable of accommodating an object to be processed and subjecting the object to be processed to a heat process;
 a cylindrical heat insulation member surrounding the processing vessel;
 a helical heating resistor arranged along an inner peripheral surface of the heat insulation member;
 a support member disposed on the inner peripheral surface of the heat insulation member in parallel with an axial direction thereof, for supporting the heating resistor at predetermined pitches along the axial direction; and
 a plurality of terminal plates axially arranged on an outside of the heating resistor at suitable intervals therebetween, the terminal plates radially passing through the heat insulation member so as to be extended outside; wherein:
 the support member includes a base part positioned on an inside of the heating resistor, and a plurality of support pieces extending radially outward from the base part through spaces between adjacent portions of the heating resistor so as to support the heating resistor, the support member being formed to have a comb-like shape; and
 an upper surface part of each of the support pieces is formed to have a curved shape in order to reduce a frictional resistance generated when the heating resistor is moved upon a thermal expansion and a thermal shrinkage thereof.

2. The heat processing furnace according to claim 1, wherein:
   each of the support pieces of the support member is formed to have a rectangular cross-section;
   the heating resistor is arranged on the inner peripheral surface of the heat insulation member such that the heating resistor is helically inclined; and
   at least one of corner portion of the upper surface part of the support piece supporting the heating resistor is formed to have a curved shape or a chamfered shape.

3. A heat processing furnace comprising:
   a processing vessel capable of accommodating an object to be processed and subjecting the object to be processed to a heat process;
   a cylindrical heat insulation member surrounding the processing vessel;
   a helical heating resistor arranged along an inner peripheral surface of the heat insulation member;
   a support member disposed on the inner peripheral surface of the heat insulation member in parallel with an axial direction thereof, for supporting the heating resistor at predetermined pitches along the axial direction; and
   a plurality of terminal plates axially arranged on an outside of the heating resistor at suitable intervals therebetween, the terminal plates radially passing through the heat insulation member so as to be extended outside; wherein:
   the support member includes a plurality of tubular members each having one end being embedded in the heat insulation member and the other end projecting radially inward;
   the heating resistor is supported on curved upper surface parts of the tubular members; and
   each of the tubular members has an enlarged diameter part fixed to one end of the tubular member embedded in the heat insulating member which is larger than the tubular member.

4. The heat processing furnace according to claim 3, wherein:
   a linear member for preventing falling of the heating resistor is disposed between the inner ends of the tubular members, which are adjacent to each other in an up and down direction; and
   the linear member passes through shaft holes of the upper and the lower tubular members so as to be embedded and fixed in the heat insulation member.

5. The heat processing furnace according to claim 3, wherein
   a support column for preventing falling of the heating resistor is disposed on the inner ends of the tubular members, which are arranged in an up and down direction.

6. The heat processing furnace according to claim 3, wherein
   an annular member for preventing falling of the heating resistor is fitted to the inner end of each of the tubular members.

7. The heat processing furnace according to claim 3, wherein
   each of the tubular members is structured as a blowing nozzle for a forcible cooling operation.

8. The heat processing furnace according to claim 3, wherein
   each of the tubular members is located such that an inner end side thereof is inclined downward.

* * * * *